A semiconductor memory device including a plurality of memory cells arranged in a matrix; a plurality of bit lines; and a plurality of word lines controlled by column addresses for the same row addresses of the memory cells, wherein memory cells belonging to the same row are operatively connected to the bit lines by the plurality of word lines having the same row address and different column addresses.

8 Claims, 10 Drawing Sheets

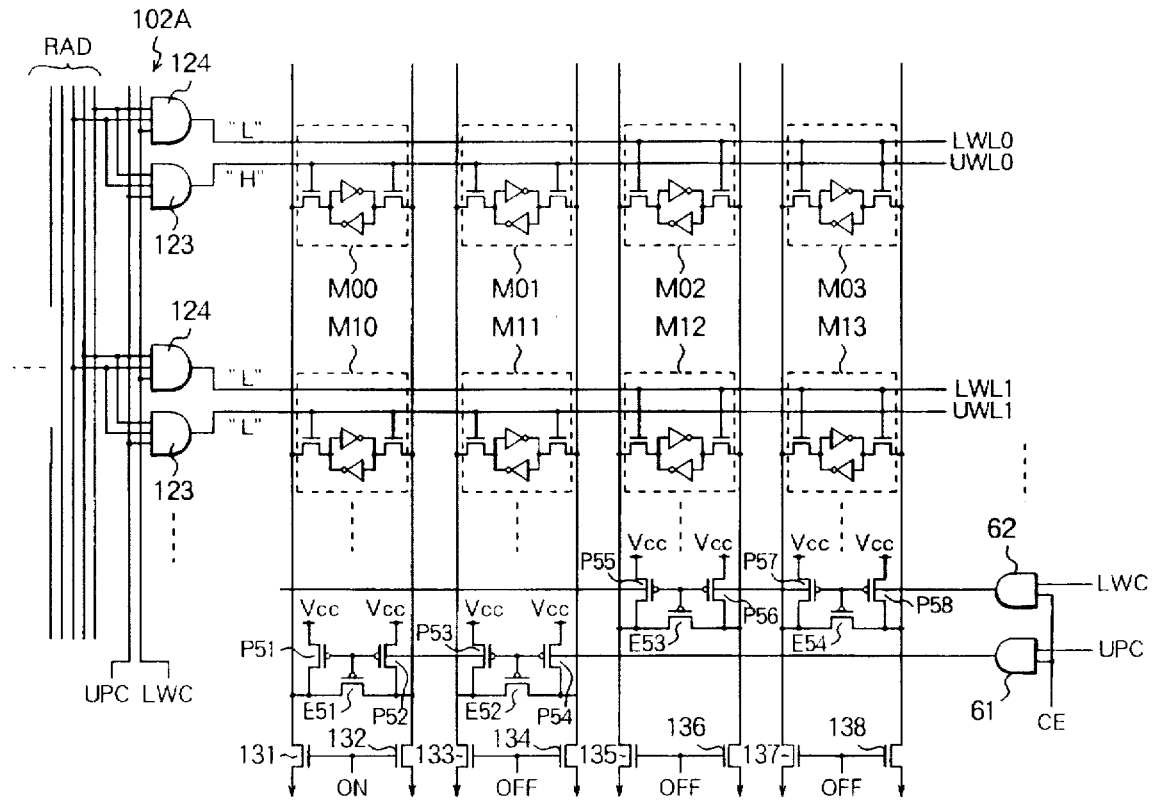

FIG. 3
(Prior Art)

⇒ HORIZONTAL-DOMAIN FREQUENCY HIGH

↓ VERTICAL-DOMAIN FREQUENCY HIGH

| 1  | 2  | 6  | 7  | 15 | 16 | 28 | 29 |
|----|----|----|----|----|----|----|----|
| 3  | 5  | 8  | 14 | 17 | 27 | 30 | 43 |
| 4  | 9  | 13 | 18 | 26 | 31 | 42 | 44 |
| 10 | 12 | 19 | 25 | 32 | 41 | 45 | 54 |
| 11 | 20 | 24 | 33 | 40 | 46 | 53 | 55 |
| 21 | 23 | 34 | 39 | 47 | 52 | 56 | 61 |
| 22 | 35 | 38 | 48 | 51 | 57 | 60 | 62 |
| 36 | 37 | 49 | 50 | 58 | 59 | 63 | 64 |

FIG. 4A
(Prior Art)

16 ROWS

| 1  | 2  | 3  | 4  |
|----|----|----|----|
| 5  | 6  | 7  | 8  |
| ⋮  | ⋮  | ⋮  | ⋮  |
| 61 | 62 | 63 | 64 |

4 COLUMNS

FIG. 4B
(Prior Art)

32 ROWS

| 1  | 2  |
|----|----|
| 3  | 4  |
| ⋮  | ⋮  |
| 63 | 64 |

2 COLUMNS

FIG. 6A

| ① | 2 | 3 | 4 |
|---|---|---|---|
| 5 | 6 | 7 | 8 |
|   |   |   |   |
| 61 | 62 | 63 | 64 |

16 ROWS

4 COLUMNS

FIG. 6B

| ① | 2 |
|---|---|
| 3 | 4 |
|   |   |
| 63 | 64 |

32 ROWS

2 COLUMNS

5,757,689

SEMICONDUCTOR MEMORY ACTIVATED BY PLURALITY OF WORD LINES ON SAME ROW

BACKGROUND OF THE INVENTION

1. Field of the Invention

The present invention relates to a semiconductor memory device such as a static random access memory (SRAM) performing a read and write operation of data by the charging and discharging of a bit line to which a memory cell is connected.

2. Description of the Related Art

A conventional SRAM array is constituted by cross-connecting pairs of inverters and connecting the memory cells from the nodes of the cross-connections to pairs of bit lines via pairs of access transistors driven by a row decoder. In such a configuration, when the pairs of bit lines are precharged and then a word line is selected and activated, all of the memory cells connected to the activated word line are activated. Consequently, not only the memory cell from which the information must be read, but also memory cells from which the information does not have to be read are connected to the bit lines via the access transistors. Current consequently flows from the pairs of bit lines to the ground lines of the memory cells via the access transistors.

As a result, since all of the bit lines are precharged at each access of the memory and the charges stored in the bit lines are discharged by the memory cells, a large current flows and power is wasted.

SUMMARY OF THE INVENTION

An object of the present invention is to provide a semiconductor memory device having a memory cell array obtained by arranging a plurality of memory cells in the form of a matrix in which an address-designated word line is activated to operatively connect a memory cell and a bit line to make them send and receive data, wherein at least two word lines are provided which are controlled by the column address for an identical row address and wherein the memory cells belonging to the same row are connected to different word lines among the at least two word lines having the same row address and different column addresses.

The memory cells may be divided into at least two groups in the row direction and the memory cells belonging to the same row may be connected to the word lines having the same row address and different column addresses for every group.

For example, the above-described memory cells may be divided into the two groups of an even number group and an odd number group.

The memory cells may also be divided into at least an upper significant group and a lower significant group.

Alternatively, at least two word lines controlled by the column addresses for the same row address may be selectively connected inside of the memory cell or outside of the memory cell.

Further, in the semiconductor memory device of the present invention, a transistor is provided which can selectively set the potential of a bit line at a predetermined potential for every column and a circuit is provided which can selectively control only the transistor for setting the predetermined potential of the bit line to be connected to the memory cell which is activated by designation of an address.

By the above configuration, among a plurality of memory cells belonging to the same row, only the memory cells connected to the activated word line (among the at least two word lines), for example, either of the memory cells belonging to the even number group or the odd number group or the upper significant group or the lower significant group, are activated, therefore the number of the bit lines for which the re-precharge becomes necessary decreased by half or more in comparison with the memory device in which all of the memory cells belonging to the same row are connected to an identical word line.

Accordingly, the increase of the power consumption accompanying the charge and discharge of excess bit lines is suppressed.

BRIEF DESCRIPTION OF THE DRAWINGS

The present invention may be more fully understood from the description of the preferred embodiments of the invention set forth below, together with the accompanying drawings, in which:

FIG. 3 is an explanatory view of a meander-scan in an image compression coding system.

FIG. 4, consisting of FIGS. 4A and 4B is a view for explaining a problem where the meander-scan of the conventional semiconductor memory device is carried out.

FIGS. 6A to 6B are views for explaining advantages where the meander-scan is carried out in the semiconductor memory device of FIG. 5.

DESCRIPTION OF THE PREFERRED EMBODIMENTS

Before describing the preferred embodiments of the present invention, a more detailed explanation will be given of the related art with reference to the drawings for background purposes.

Figure 1:
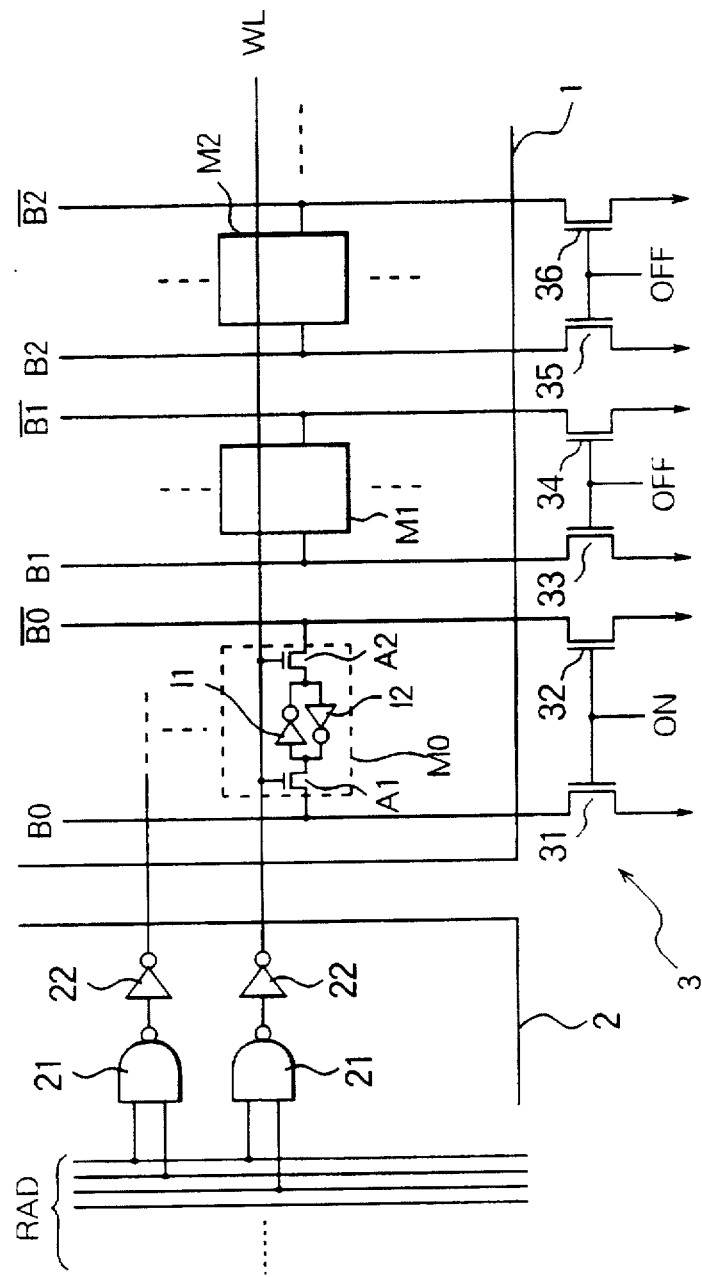
FIG. 1 is a view showing an example of the configuration of a conventional semiconductor memory device.

FIG. 1 is a circuit diagram showing an example of the configuration of a semiconductor memory device provided with an SRAM cell array of a type where a DC current flows through the bit lines at the time of a read operation.

In FIG. 1, reference numeral 1 denotes a SRAM cell array; 2, a row decoder; 3, a column gate; M0, M1, M2, . . . denote SRAM cells; B0, $\overline{B0}$, B1, $\overline{B1}$, B2, and $\overline{B2}$ denote bit lines; and WL denotes a word line.

In the SRAM cell array 1, the SRAM cells M0, M1, M2, . . . each comprising a flip-flop formed by inverters I1 and I2 which are cross-coupled with respect to each other, are arranged in the form of a matrix. The gates of access transistors A1 and A2 are connected to a common word line WL with which the cells arranged in the same row are driven by a row decoder 2. The access transistors A1 and A2 of the respective SRAM cells M0, M1, M2, . . . are connected to pairs of bit lines B0 and $\overline{B0}$, B1 and $\overline{B1}$, and B2 and $\overline{B2}$, respectively.

The row decoder 2 is constituted by the same number of 2-input NAND gates 21 as the number of the word lines to which any two lines among a plurality of row address decode lines RAD are connected and a plurality of inverters 22 with inputs connected to the outputs of the NAND gates 21 and with outputs connected to ends of the word lines WL.

Also, the respective pairs of bit lines B0 and $\overline{B0}$, B1 and $\overline{B1}$, and B2 and $\overline{B2}$ are connected to their column gates 31 to 36 . . . comprising n-channel MOS transistors for connecting these pairs of bit lines to not illustrated sense amplifiers.

In such a configuration, when the pairs of bit lines B0 and $\overline{B0}$, B1 and $\overline{B1}$, and B2 and $\overline{B2}$ are precharged and, for example, the word line WL is selected and activated by the row decoder 2 based on an address designation, all of memory cells M0, M1, and M2 which are connected to the activated word line WL, including the memory cells not subjected to the address designation, are activated.

For example, even in a case where only the pair of bit lines B0 and $\overline{B0}$ are selected by the column gates 31 and 32 based on the address designation, not only the pair of bit lines B0 and $\overline{B0}$, but also the pairs of bit lines B1 and $\overline{B1}$ and B2 and $\overline{B2}$ of the non-selected columns are discharged based on the memory data of the memory cells M1 and M2 respectively.

Accordingly, in the next cycle, to prevent erroneous writing, all of the bit lines have to be precharged again.

Figure 2:
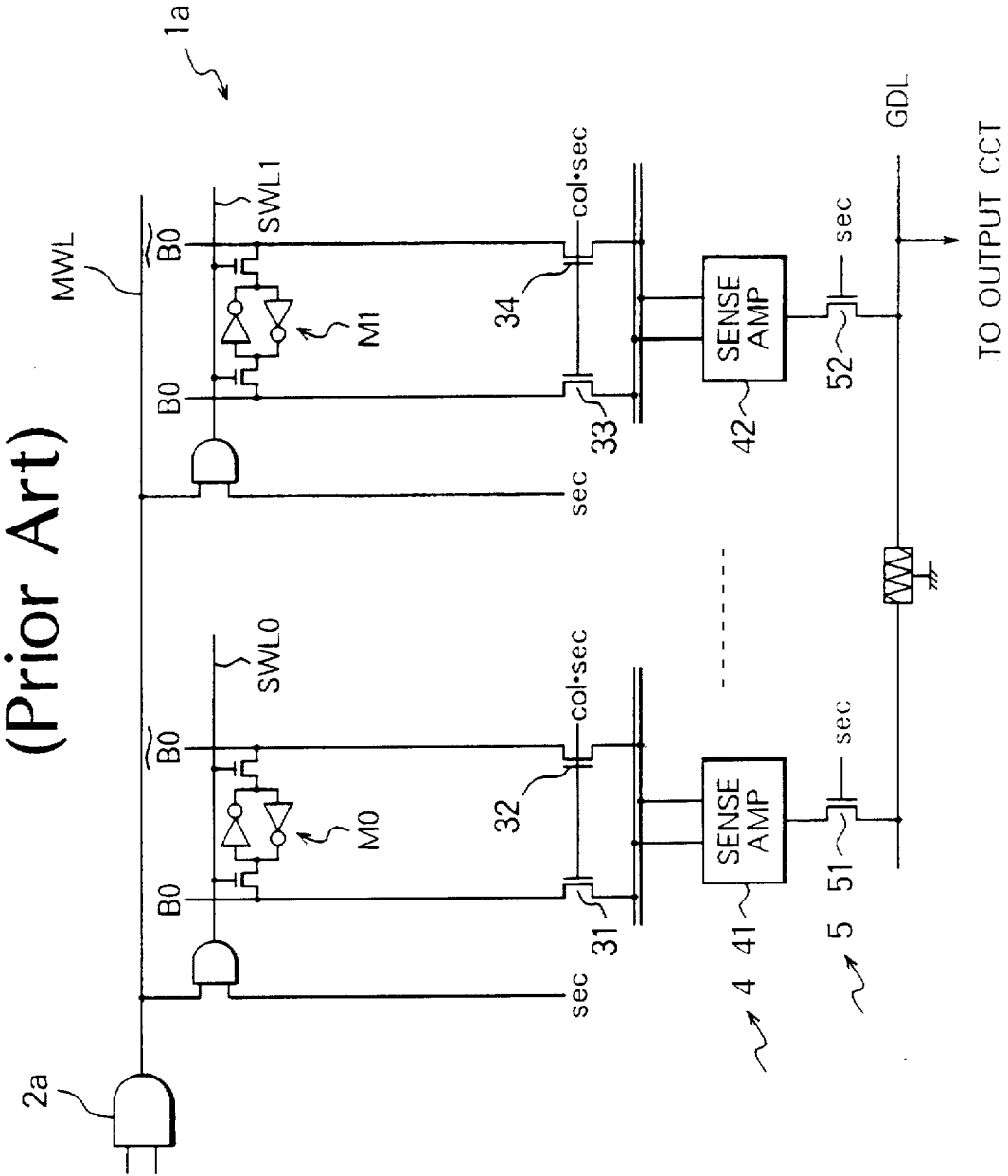
FIG. 2 is a view showing another example of the configuration of a conventional semiconductor memory device.

FIG. 2 is a circuit diagram showing an example of the configuration of a semiconductor memory device provided with a SRAM cell array of an type where the memory cell array is divided into sections irrespective of the presence/absence of a DC pull-up.

In FIG. 2, reference numeral 1a denotes an SRAM cell array; 2a, a main word line decoder serving as the row decoder; 31, 32, 33, and 34 denote column gates; 4 (41, 42), a semiconductor amplifier; 5 (51, 52), a select gate; M0 and M1 denote SRAM cells; MWL, a main word line; SWL0 and SWL1 denote section word lines; GDL, a global data line; and B0 and $\overline{B0}$ and B1 and $\overline{B1}$ denote bit lines.

In this memory device, as shown in FIG. 2, the memory cell array is divided into sections by dividing the word lines and the sense amplifiers 41 and 42 spanning the space between sections are connected by the global data line GDL.

Due to this, the number of the memory cells and pairs of bit lines which are activated at one time is decreased, thereby lowering the power consumption.

In the above-mentioned memory device of the first related art, not only the pair of bit lines B0 and $\overline{B0}$ of the selected column, but also the pairs of bit lines B1 and $\overline{B1}$ and B2 and $\overline{B2}$ of the non-selected columns are discharged based on the memory data of the memory cells M1 and M2. In the next cycle, therefore, it is necessary to precharge all bit lines again so as to prevent erroneous writing, and therefore an increase in the power consumption is induced.

For example, in the image compression coding system of the JPEG, MPEG, etc., to perform efficient coding, a read operation of the data called a "meander-scan" is carried out in the order shown in FIG. 3. At this time, in a conventional RAM, as shown in FIGS. 4A and 4B, even if just one bit of data is to be read out, as indicated by the solid line circles, other data which are connected to the word line are activated and the bit lines are discharged. Therefore, another charge is carried out in the next cycle, so power is wasted.

Also, in the memory device of the second related art, an increase of the power consumption can be suppressed, but a global data line GDL for connecting the sense amplifiers spanning the sections becomes necessary, and an increased delay results.

Figure 5:
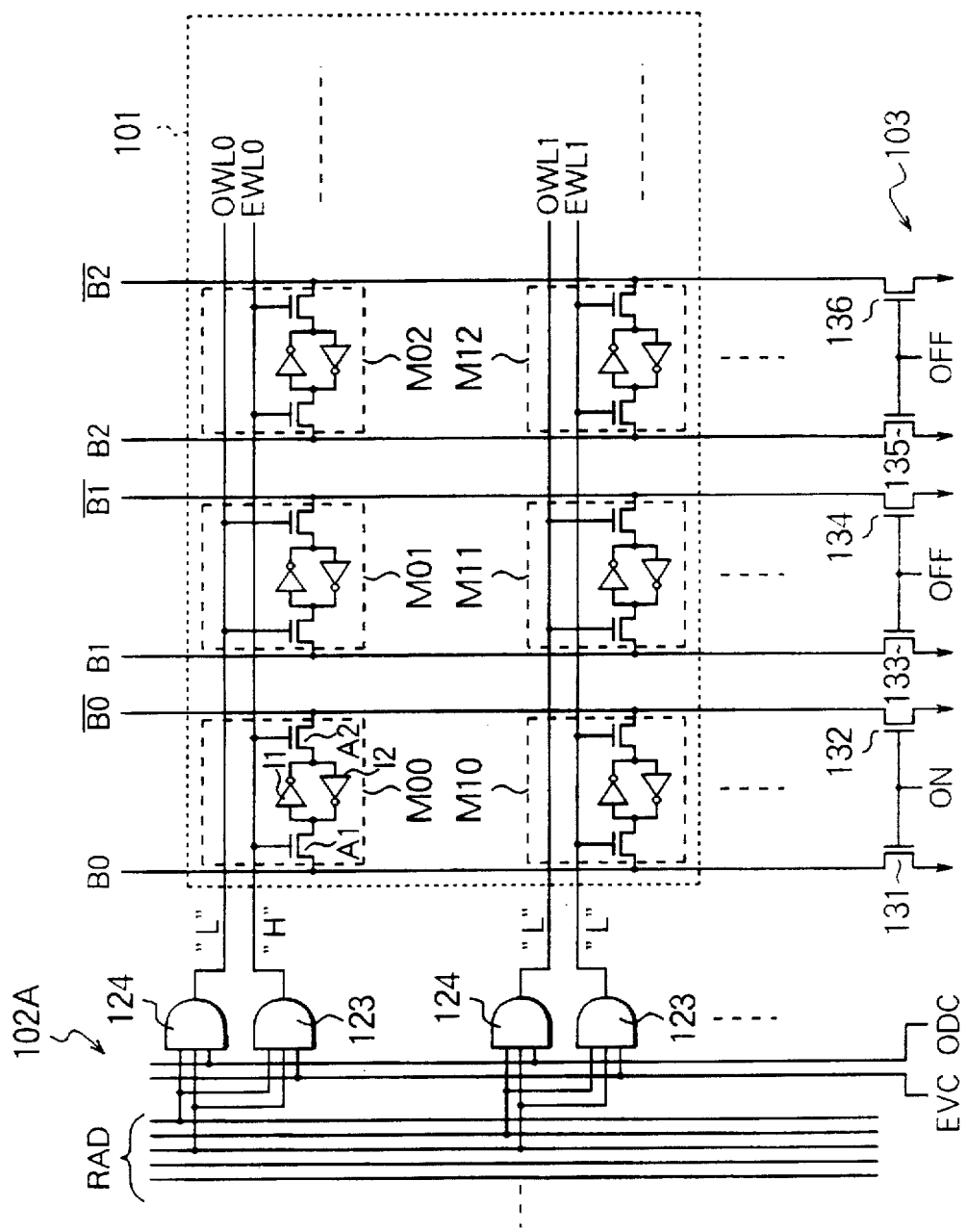
FIG. 5 is a circuit diagram showing a first embodiment of a semiconductor memory device according to the present invention.

FIG. 5 is a circuit diagram showing a first embodiment of the semiconductor memory device according to the present invention.

In the figure, reference numeral 101 denotes a SRAM cell array; 102A, a row decoder; 103 denotes column gates; M00, M01, M02, M10, M11, and M12 denote SRAM cells; B0 and $\overline{B0}$, B1 and $\overline{B1}$, and B2 and $\overline{B2}$ denote bit lines; and OWL0, EWL0, OWL1, and EWL1 denote word lines.

The present device is provided with two word lines OWL0 and EWL0, OWL1 and EWL1, . . . controlled by the column address signals EVC and ODC corresponding to two columns, that is, even number and odd number columns, with respect to the same row address.

More specifically, the row decoder 102A is provided for each row and is constituted by a 3-input AND gate 123 to which any two lines among a plurality of row address decode lines RAD are connected and an input line of the column address signal EVC for the even number column control is connected and by a 3-input AND gate 124 to which similarly any two lines among the row address decode lines RAD are connected and an input line of the column address signal ODC for the odd number column control is connected.

The outputs of the 3-input AND gates 123 are connected to the even number side word lines EWL0 and EWL1 of each row, and the outputs of the 3-input AND gates 124 are connected to the odd number side word lines OWL0 and OWL1 of each row.

Among the gates of the access transistors A1 and A2 in the memory cells connected to the pairs of bit lines B0 and $\overline{B0}$, B1 and $\overline{B1}$, and B2 and $\overline{B2}$, respectively the gates of the access transistors A1 and A2 of the memory cells M00 and M02, arranged in the even number columns are connected to the word line EWL 0, and the gates of the access transistors A1 and A2 of the memory cells M10 and M12 are connected to the word line EWL1.

The gates of the access transistors A1 and A2 of the memory cell M0 arranged in an odd number column are connected to the word line OWL0, and the gates of the access transistors A1 and A2 of the memory cell M11 arranged in an odd number column are connected to the word line OWL1.

Next, a read operation by the above configuration will be explained by taking as an example a case where the memory cell M00 of the column 0 is selected.

First, in the precharge period, all of the pairs of bit lines B0 and $\overline{B0}$, B1 and $\overline{B1}$, and B2 and $\overline{B2}$ are held at a high level "H".

Next, the predetermined two lines selecting the uppermost row among the row address decode lines RAD are set at a high level and, at the same time, the column address signal EVC for the even number column is set at the high level and input to one input end of the 3-input AND gate 23.

Due to this, only the word line EWL0 is held at the high level "H". The other word lines OWL0, EWL1, and OWL1 are held at a low level "L".

Due to this, the memory data of the memory cells M00 and M02 connected to the word line EWL0 are output to the pairs of bit lines B0 and $\overline{B0}$ and B2 and $\overline{B2}$. At this time, one of the pairs of bit lines B0 and $\overline{B0}$ and B2 and $\overline{B2}$ is discharged in accordance with the memory data. There is no discharge of the pair of bit lines B1 and $\overline{B1}$.

Next, only the column gates 131 and 132 connected to the pair of bit lines B0 and $\overline{B0}$ are held in a conductive state, the data of the memory cell M00 output to the pair of bit lines B0 and $\overline{B0}$ is transferred to the not illustrated sense amplifier, and the potential difference between the pair of bit lines B0 and $\overline{B0}$ is amplified.

In this case, since there is no DC pull-up transistor, the potential of the bit lines is discharged in the activated memory cell, and therefore it is necessary to precharge the discharged bit lines in the next cycle, but since just one of the even number column or the odd number column is activated even if the same row address is selected, the number of the bit lines for which the re-precharge is only necessary becomes half in that of the conventional memory device shown in FIG. 1, and the increase of the power consumption accompanied with the charging and discharging of excess bit lines is suppressed.

As explained above, according to the first embodiment of the present invention, since two word lines OWL0 and EWL0, OWL1 and EWL1, . . . controlled by the column address signals EVC and ODC corresponding to the two columns of even number and odd number are provided for the same row address, the number of the bit lines to be discharged (activated) can be decreased without division of the memory cell array and the power consumption can be lowered.

For example, in the image compression coding system of the JPEG, MPEG, etc., to perform efficient coding, when a read operation of data called a meander-scan is carried out in the order shown in FIG. 3, as indicated by the solid circles of FIG. 6A and FIG. 6B, only one bit of data is activated. The other data are not activated. Accordingly, wasted power is minimized.

Figure 7:
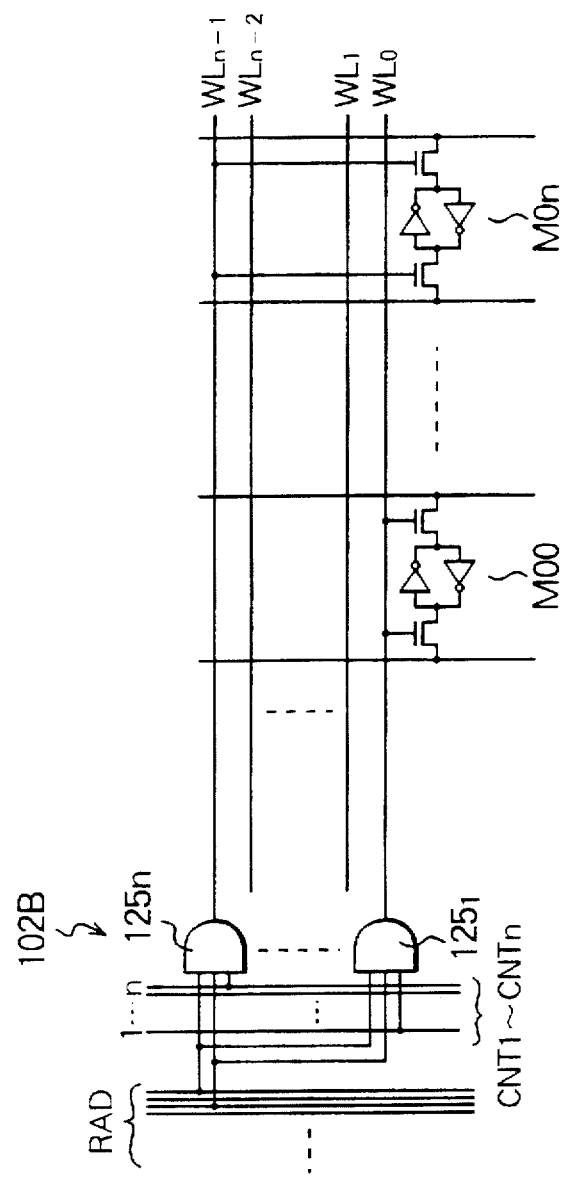
FIG. 7 is a circuit diagram showing a second embodiment of the semiconductor memory device according to the present invention.

FIG. 7 is a circuit diagram showing a second embodiment of the semiconductor memory device according to the present invention.

The point of difference of the second embodiment of the present invention from the above-mentioned first embodiment resides in the fact that, in place of the two even number and odd number column switching word lines provided with respect to the same row address, the column word line is expanded to an n-bit line.

More specifically, it is configured so that any two lines among the row address decode lines RAD are connected to the two inputs of the n number of 3-input gates $125_1$, to $125_n$ to the output side of which the word lines WL0 to WLn-1 are connected and so that a predetermined line among the column control lines CNT1 to CNTn is connected to the remaining one input.

In the second embodiment of the present invention as well, a similar effect to the effect of the above-mentioned first embodiment can be obtained.

It is also possible to connect the word line group and the memory cell inside of the memory cell or using the area outside the cell. Due to this, the number of the bit lines which activate a memory cell without division of the array into sections as in the device of the related art shown in FIG. 2 can be decreased. As a result, the sense amplifier does not have to span different sections, the global data line becomes unnecessary, and the increased delay can be prevented.

Figure 8:
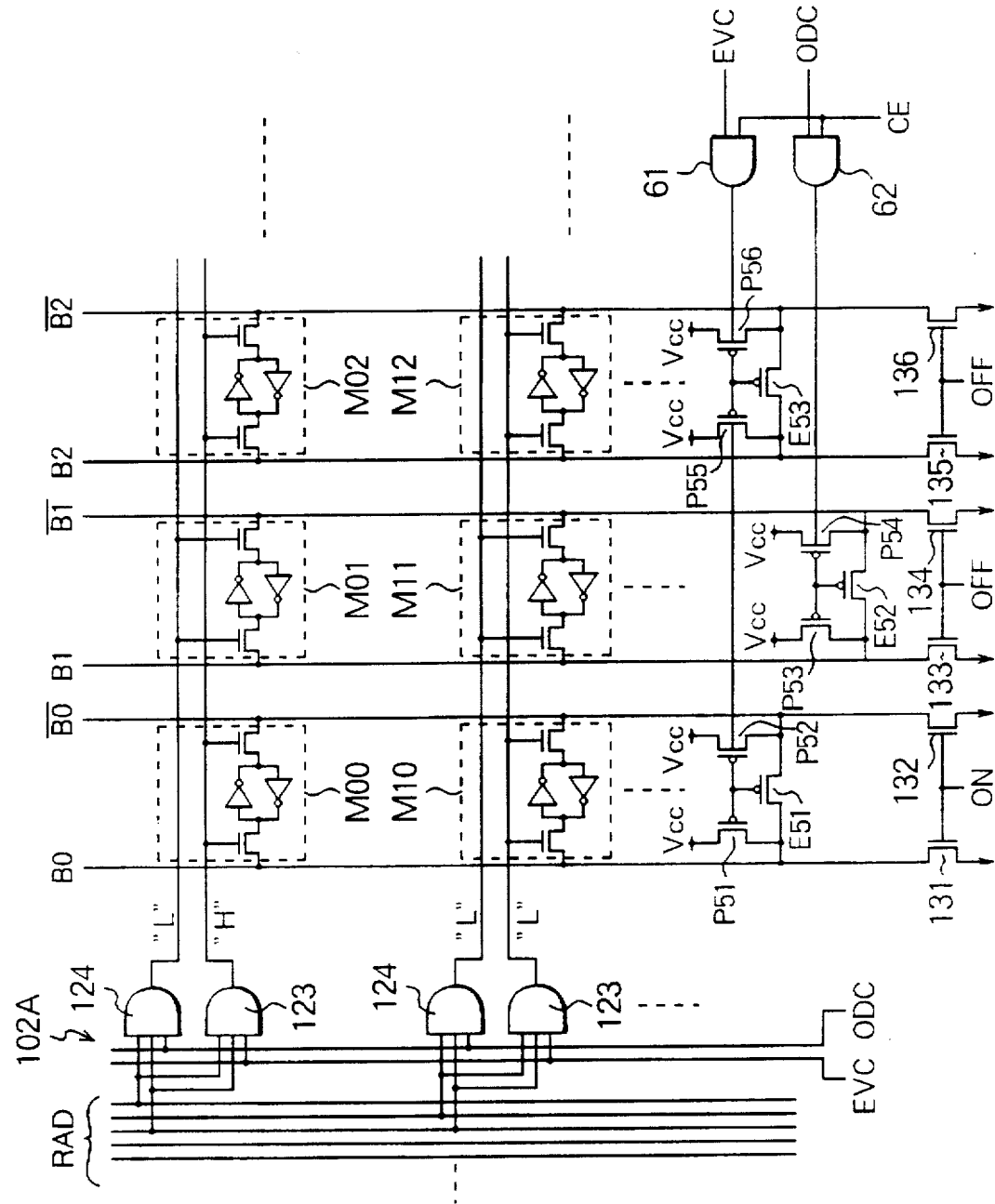
FIG. 8 is a circuit diagram showing a third embodiment of the semiconductor memory device according to the present invention.

FIG. 8 is a circuit diagram showing a third embodiment of the semiconductor memory device according to the present invention.

The point of difference of the third embodiment of the present invention from the above-mentioned first embodiment resides in the fact that a precharge/pull-up transistor and an equalizing transistor are controlled in association with the memory cell to be activated.

More specifically, the equalizing transistors E51, E52, and E53, comprising p-channel MOS transistors, are connected between the pairs of bit lines B0 and $\overline{B0}$, B1 and $\overline{B1}$, and B2 and $\overline{B2}$, respectively. Further, a precharge/pull-up transistor P51 comprising a p-channel MOS transistor is connected between a power source voltage Vcc feed line and the bit line B0; and a precharge/pull-up transistor P52 is connected between the power source voltage Vcc feed line and the inverse bit line $\overline{B0}$. Similarly, a precharge/pull-up transistor P53 is connected between the power source voltage Vcc feed line and the bit line B1; and a precharge/pull-up transistor P54 is connected between the power source voltage Vcc feed line and the inverse bit line $\overline{B1}$; a precharge/pull-up transistor P55 is connected between the power source voltage Vcc feed line and the bit line B2; and a precharge/pull-up transistor P56 is connected between the power source voltage Vcc feed line and the inverse bit line $\overline{B2}$.

The gates of the transistors P51, P52, and E51 for the even number column and the gates of the transistors P55, P56, and E53 are connected to the output of the AND gate 61 obtaining a logical AND between a chip enable signal CE and the column address signal EVC for the even number column; and the gates of the transistors P53, P54, and E52 for the odd number column are connected to the output of the AND gate 62 obtaining a logical AND between the chip enable signal CE and the column address signal ODC for the odd number column.

In this case, the memory cells of the even number column and the odd number column are selectively activated by the column address signal EVC or ODC.

In the same way as the case of the first embodiment, when assuming that the memory cell M00 of the column 0 is selected, since the column address signal EVC is at a high level, the output of the AND gate 61 also becomes high. As a result, the transistors P51, P52, and E51 for the even number column and the transistors P55, P56, and E53 are held in the non-conductive state, and amplitude appears at the respective pairs of the bit lines B0 and $\overline{B0}$ and B2 and $\overline{B2}$.

At this time, the column address signal ODC is at a low level, and therefore the output of the AND gate 62 is held at a low level. As a result, the transistors P53, P54, and E52 for the odd number column are held in the conductive state, the pair of bit lines B1 and $\overline{B1}$ are not driven, and the consumption of the current is reduced.

In the next cycle, the transistors P51, P52, and E51 for the even numbered column which were discharged and the transistors P55, P56, and E53 are held in the conductive state, a precharge is carried out, and only the even number or odd number is selectively held in the non-conductive state again.

According to the third embodiment of the present invention, a similar effect to the effect of the above-mentioned first embodiment can be obtained.

Figure 9:
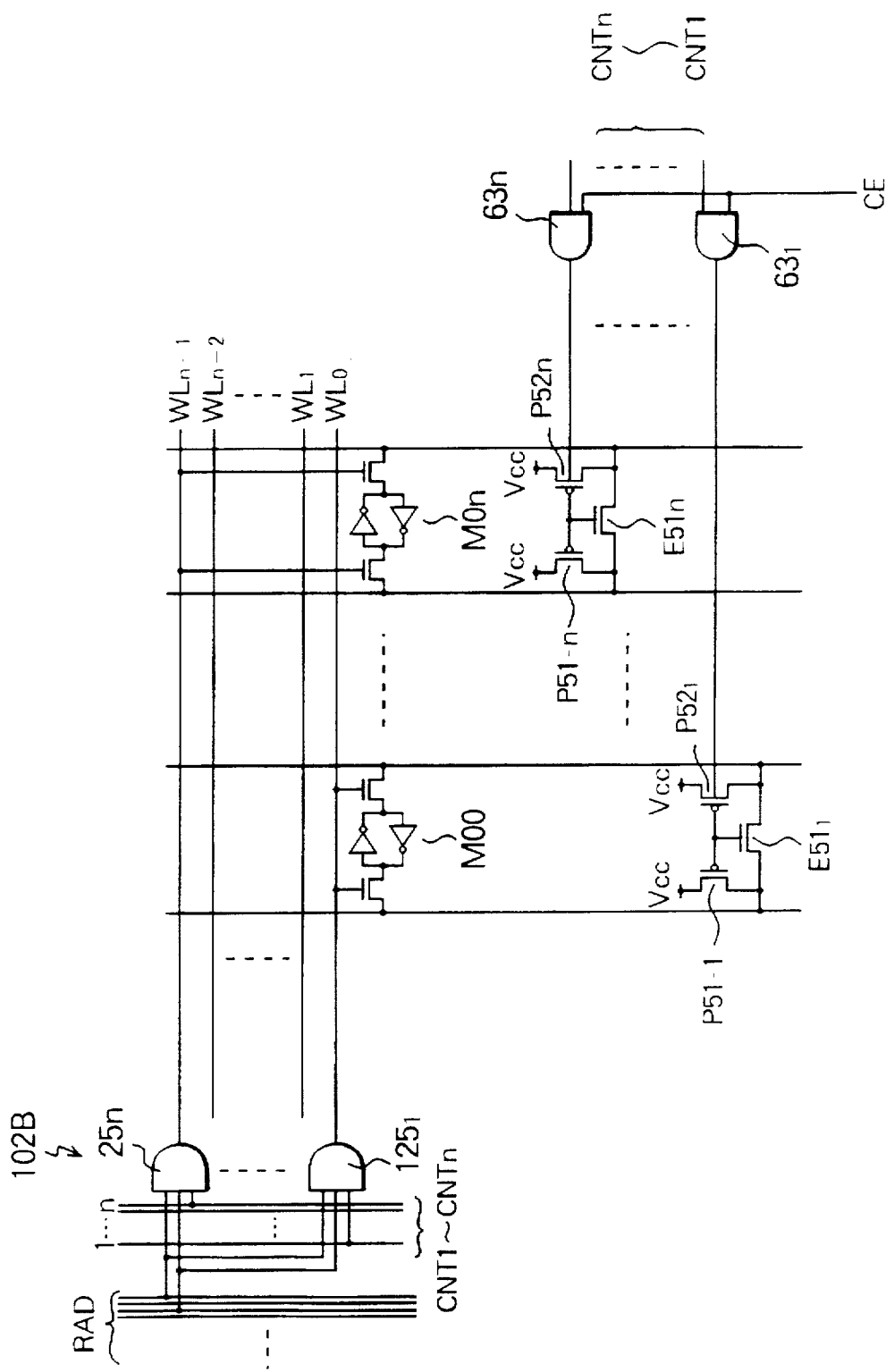
FIG. 9 is a circuit diagram showing a fourth embodiment of the semiconductor memory device according to the present invention.

FIG. 9 is a circuit diagram showing a fourth embodiment of the semiconductor memory device according to the present invention.

In the present fourth embodiment, in the same way as the above-mentioned second embodiment, instead of two even number and odd number column switching word lines being provided with respect to the same row address, the word line is extended to n bits of column word line. Further, in the same way as the case of the third embodiment, it is constituted so as to control the precharge/pull-up transistors and equalizing transistors in association with the memory cells to be activated.

According to the fourth embodiment of the present invention, an effect similar to the effect of the above-mentioned second embodiment can be obtained.

Figure 10:
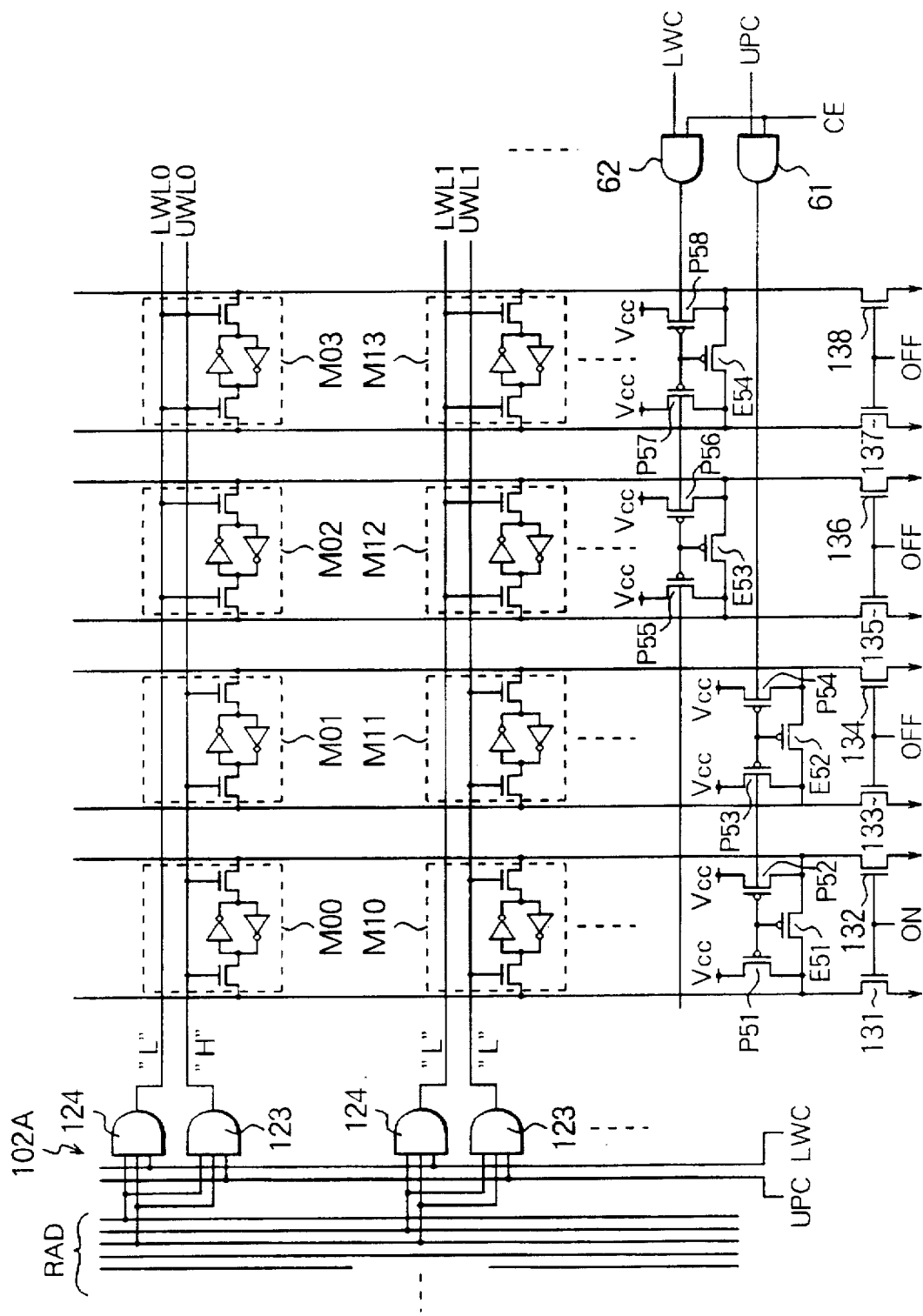
FIG. 10 is a circuit diagram showing a fifth embodiment of the semiconductor memory device according to the present invention.

FIG. 10 is a circuit diagram showing a fifth embodiment of the semiconductor memory device according to the present invention.

The point of difference of the fifth embodiment of the present invention from the above-mentioned third embodiment resides in the fact that, instead of dividing the word lines to two sets of odd number and even number lines, the word lines are divided and controlled based on the concept of the upper significant column and the lower significant column.

In this case, the columns 0 and 1, in which the bit line pairs B0 and $\overline{B0}$ and B1 and $\overline{B1}$ are arranged, are regarded as the upper significant columns, and the columns 2 and 3, in which the pairs of bit lines B2 and $\overline{B2}$ and B3 and $\overline{B3}$ are arranged, are regarded as the lower significant columns.

Note that, in FIG. 10, UWL0 and UWL1 denote word lines for the upper significant column; LWL0 and LWL1 denote word lines for the lower significant column; UPC denotes a column address signal for the upper significant column; and LWC, a column address signal for the lower significant column.

The output of the AND gate 61 is connected to the gates of the precharge/pull-up transistors P51 to P54 and equalizing transistors E51 and E52 for the upper significant column; and the output of the AND gate 62 is connected to the gates of the precharge/pull-up transistors P55 to P58 and equalizing transistors E53 and E54 for the lower significant column.

According to the fifth embodiment of the present invention, an effect similar to the effect of the above-mentioned first embodiment can be obtained.

Figure 11:
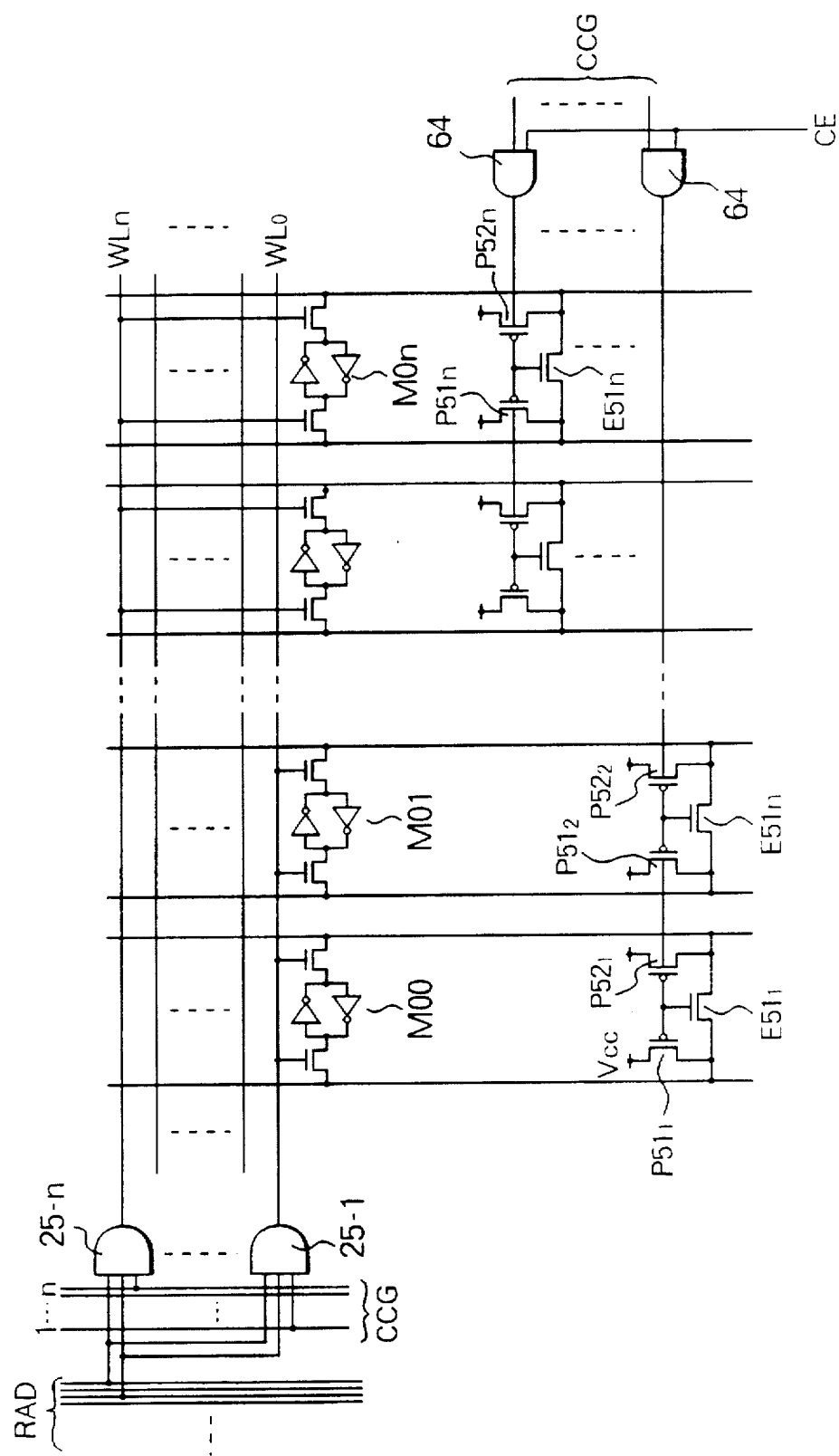
FIG. 11 is a circuit diagram showing a sixth embodiment of the semiconductor memory device according to the present invention.

FIG. 11 is a circuit diagram showing a sixth embodiment of the semiconductor memory device according to the present invention.

The point of difference of the sixth embodiment of the present invention from the above-mentioned second embodiment resides in the fact that, instead of the extension of the word line to n bits of column word lines and control for each of the column word lines, the word lines are divided into a plurality of column groups and controlled in units of those groups.

Also, the precharge/pull-up transistors and equalizing transistors in this case are controlled in the same way as the above-mentioned fifth embodiment.

Note that, in the figure, CCG denotes the column group control line.

According to the sixth embodiment of the present invention, an effect similar to the effect of the above-mentioned first embodiment can be obtained.

While the invention has been described by reference to specific embodiments chosen for purposes of illustration, it should be apparent that numerous modifications could be made thereto by those skilled in the art without departing from the basic concept and scope of the invention.

What is claimed is:

1. A semiconductor memory device comprising:
a plurality of memory cells arranged in a matrix of rows and columns;
a plurality of bit lines; and
a plurality of word lines controlled by column addresses and row addresses,
wherein memory cells belonging to a particular row and having a particular row address are operatively connected to the bit lines by a plurality of said word lines which have said particular row address and different column addresses,
wherein the memory cells are divided into a plurality of groups in the row direction wherein memory cells belonging to a particular row and having a particular row address are connected to word lines having said particular row address and different column addresses, and
wherein the memory cells belonging to the same row are further divided into two groups consisting of an upper significant group and a lower significant group.

2. A semiconductor memory device as in claim 1, further comprising:
a transistor connected to each column for selectively setting bit lines associated with the column to which said transistor is connected to a predetermined potential; and
a control circuit selectively activating only the transistors which correspond to columns having memory cells to be activated by designation of a column address.

3. A semiconductor memory device as in claim 1, wherein the memory cells belonging to a particular row are divided into two groups consisting of an even numbered group and an odd numbered group.

4. A semiconductor memory device as in claim 3, further comprising:
a transistor connected to each column for selectively setting bit lines associated with the column to which said transistor is connected to a predetermined potential; and
a control circuit selectively activating only the transistors which correspond to columns having memory cells to be activated by either an even or odd column address designation.

5. A semiconductor memory device as in claim 1, wherein at least two word lines controlled by different column addresses and a single row address are selectively and individually subject to a high or low voltage under the control of a row decoder.

6. A semiconductor memory device as in claim 5, further comprising:
a transistor connected to each column for selectively setting bit lines associated with the column to which said transistor is connected to a predetermined potential; and
a control circuit selectively activating only the transistors which correspond to columns having memory cells to be activated by either an upper significant group or a lower significant group column address designation.

7. A semiconductor memory device as in claim 5, wherein said row decoder receives a first signal for controlling even numbered columns of said matrix, and a second signal for controlling odd numbered columns of said matrix.

8. A semiconductor memory device comprising:
a plurality of memory cells arranged in a matrix of rows and columns;

a plurality of bit lines;

a plurality of word lines controlled by column addresses and row addresses;

a transistor connected to each column for selectively setting the bit lines associated with the column to which said transistor is connected to a predetermined potential; and a control circuit selectively activating only the transistors which correspond to columns having memory cells to be activated by designation of a column address;

wherein memory cells belonging to a particular row and having a particular row address are operatively connected to the bit lines by a plurality of said word lines which have said particular row address and different column addresses, and wherein the memory cells are divided into a plurality of groups in the row direction wherein memory cells belonging to a particular row and having a particular row address are connected to word lines having said particular row address and different column addresses.

* * * * *